United States Patent
Heile

(10) Patent No.: US 6,344,989 B1
(45) Date of Patent: *Feb. 5, 2002

(54) PROGRAMMABLE LOGIC DEVICES WITH IMPROVED CONTENT ADDRESSABLE MEMORY CAPABILITIES

(75) Inventor: Francis B. Heile, Santa Clara, CA (US)

(73) Assignee: Altera Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/658,914

(22) Filed: Sep. 11, 2000

Related U.S. Application Data

(63) Continuation of application No. 09/292,448, filed on Apr. 15, 1999, now Pat. No. 6,144,573.
(60) Provisional application No. 60/090,757, filed on Jun. 26, 1998.

(51) Int. Cl.[7] .................. G11C 19/08; H03K 19/177
(52) U.S. Cl. .................................... 365/49; 326/39
(58) Field of Search ........................ 365/49, 185.24; 326/39, 40, 41

(56) References Cited

U.S. PATENT DOCUMENTS

| 3,473,160 A | 10/1969 | Wahlstrom | 340/172.5 |
|---|---|---|---|
| 3,849,638 A | 11/1974 | Greer | 235/152 |
| 4,740,917 A | 4/1988 | Denis et al. | 365/49 |
| 4,876,466 A | 10/1989 | Kondou et al. | 307/465 |
| 4,912,345 A | 3/1990 | Steele et al. | 307/465 |
| 4,975,601 A | 12/1990 | Steele | 307/465 |
| 5,027,011 A | 6/1991 | Steele | 307/465 |
| 5,099,150 A | 3/1992 | Steele | 307/465 |
| 5,121,006 A | 6/1992 | Pedersen | 307/465 |
| 5,128,559 A | 7/1992 | Steele | 307/465 |
| 5,144,582 A | 9/1992 | Steele | 365/189.08 |

(List continued on next page.)

OTHER PUBLICATIONS

C. Barre, "L'utilisation du FPLA; Evaluez les Applications d'un Composant Puissant qui Peut se Reveler trés Economique", Electronique & Applications Industrielles, EAI 250, Apr. 1, 1978, pp. 21–25.

D. Bursky, "Combination RAM/PLD Opens New Application Options", Electronic Design, May 23, 1991, pp. 138–140.

"iFX8160 10ns FLEXlogic FPGA with SRAM Option; Advance Information", Intel Corporation, Oct. 1993, pp. 2–47 through 2–56.

"iFX780 10ns FLEXlogic FPGA with SRAM Option: Preliminary", Intel Corporation, Nov. 1993, Order No. 290459–004, pp. 2–24 through 2–46.

T. K–K. Ngai, "An SRAM–Programmable Field–Reconfigurable Memory", Master of Applied Science degree thesis submitted to the Department of Electrical Engineering of the University of Toronto, 1994.

A. Stansfield et al., "The Design of a New FPGA Architecture", Proceedings Field Programmable Logic (FPL) 1995, Springer Lecture Notes in Computer Science 975, pp. 1–14.

A. Kaviani et al., "Hybrid FPGA Architecture", Proceedings 4th International Symposium on FPGAs (FPGA 96), Feb. 1996.

(List continued on next page.)

Primary Examiner—Trong Phan
(74) Attorney, Agent, or Firm—Fish & Neave; Robert R. Jackson; Joo-Youn Park

(57) ABSTRACT

A programmable logic array integrated circuit device includes regions of programmable logic, regions of memory, and a programmable network of interconnection conductors for selectively conveying signals to, from, and between the regions of logic and memory. The memory regions are usable as content addressable memory. Circuitry is provided for facilitating programming of the memory in content addressable mode.

27 Claims, 9 Drawing Sheets

U.S. PATENT DOCUMENTS

| | | | |
|---|---|---|---|
| 5,226,005 A | | 7/1993 | Lee et al. ..................... 365/49 |
| RE34,363 E | | 8/1993 | Freeman ..................... 307/465 |
| 5,270,587 A | | 12/1993 | Zagar ......................... 307/469 |
| 5,282,163 A | | 1/1994 | Shibata .................. 365/189.08 |
| 5,302,865 A | | 4/1994 | Steele et al. ................ 307/465 |
| 5,319,589 A | | 6/1994 | Yamagata et al. ............ 365/49 |
| 5,339,268 A | | 8/1994 | Machida ...................... 365/49 |
| 5,362,999 A | | 11/1994 | Chiang ........................ 326/44 |
| 5,383,146 A | | 1/1995 | Threewitt .................... 365/49 |
| 5,386,155 A | | 1/1995 | Steele et al. .................. 326/37 |
| 5,408,434 A | | 4/1995 | Stansfield ............. 365/189.08 |
| 5,450,608 A | | 9/1995 | Steele ........................ 395/800 |
| 5,473,267 A | | 12/1995 | Stansfield .................... 326/41 |
| 5,532,957 A | | 7/1996 | Malhi ......................... 365/154 |
| 5,557,218 A | | 9/1996 | Jang ............................ 326/40 |
| 5,559,747 A | | 9/1996 | Kasamizugami et al. ... 365/207 |
| 5,574,930 A | | 11/1996 | Halverson, Jr. et al. .... 395/800 |
| 5,689,195 A | | 11/1997 | Cliff et al. .................... 326/41 |
| 5,809,281 A | | 9/1998 | Steele et al. ........... 395/497.01 |
| 5,815,726 A | | 9/1998 | Cliff ...................... 395/800.01 |
| 5,844,854 A | | 12/1998 | Lee ....................... 365/230.03 |
| 5,936,873 A | | 8/1999 | Kongetira .................... 365/49 |
| 5,940,852 A | | 8/1999 | Rangasayee et al. ........ 711/108 |
| 6,020,759 A | * | 2/2000 | Heile .......................... 326/40 |
| 6,144,573 A | | 11/2000 | Heile .......................... 365/49 |
| 6,160,419 A | * | 12/2000 | Veenstra et al. .............. 326/40 |

OTHER PUBLICATIONS

"Next Generation FPGAs : Xilinx Next Generation FPGAs Deliver World–Class Performance", *The Power of Innovation 1997*, Xilinx, Inc., San Jose, CA, p. 7–7.

"Altera Enables System–Level Integration with Raphael Family of Embedded PLDs", Altera Corporation, San Jose, California, Aug. 31, 1998.

"Apex 20K Programmable Logic Device Family: Advance Product Brief", Altera Corporation, San Jose, California, Oct. 1998, pp. 1, 2, and 9.

"Altera Unveils New Name for Raphael: Advanced Programmable Embedded Matrix (APEX)", Altera Corporation, San Jose, California, Oct. 7, 1998.

"Apex 20K Device Family: The Embedded PLD Family for System–Level Integration", Altera Corporation, San Jose, California, after Aug. 31, 1998.

"Apex 20K Device Family: Breakthrough MultiCore Architecture", Altera Corporation, San Jose, California, after Aug. 31, 1998.

F. Heile et al., "Hybrid Product Term and LUT Based Architecture Using Embedded Memory Blocks", Proceedings of FPGA 1999 Conference, Feb. 21–23, 1999, Monterey, California.

* cited by examiner

PROGRAMMABLE LOGIC DEVICES WITH IMPROVED CONTENT ADDRESSABLE MEMORY CAPABILITIES

This application is a continuation of application Ser. No. 09/292,448, filed Apr. 15, 1999, now U.S. Pat. No. 6,144,573, which claims the benefit of United States provisional application No. 60/090,757, filed Jun. 26, 1998.

BACKGROUND OF THE INVENTION

This invention relates to programmable logic devices, and more particularly to providing programmable logic devices with content addressable memory capabilities.

Heile U.S. patent application Ser. No. 09/034,050, filed Mar. 3, 1998 (which is hereby incorporated by reference herein in its entirety), shows that programmable logic array integrated circuit devices that have large blocks of random access memory ("RAM") (or read-only memory ("ROM")) can be equipped to facilitate the performance of product term ("p-term") logic in the RAM (or ROM). (For convenience herein, the ROM alternative will be understood to be included in references to RAM.) As the immediately above-mentioned reference explains, the ability to perform p-term logic in large blocks of RAM on a programmable logic device that may also include other types of programmable logic capability (e.g., large numbers of small, programmable, look-up tables for performing look-up table logic) increases the flexibility and usability of the device.

There are also applications of programmable logic devices that would benefit from having content addressable memory capability on the devices. A content addressable memory is one in which different "words" of data are stored in different word locations in the memory, and when data matching one of the stored words is applied to the memory, the memory responds by outputting an indication of the location found to contain the applied data. Content addressable memories ("CAMs") are also sometimes called associative memories.

In view of the foregoing, it is an object of this invention to provide programmable logic devices with improved content addressable memory capabilities.

It is another object of this invention to provide programmable logic devices with content addressable memories, the contents of which can be efficiently changed during operation of the device.

SUMMARY OF THE INVENTION

These and other objects of the invention are accomplished in accordance with the principles of the invention by providing programmable logic devices of the type shown in the immediately above-mentioned reference with output circuitry for the RAM blocks that allows the p-term capabilities of the device to be used to provide content addressable memory outputs if content addressable memory operation is desired. In addition, to increase the efficiency with which the contents of a RAM block being used as a content addressable memory can be changed, circuitry is provided for allowing certain read address signals to be applied to certain write address leads of the RAM block, with selective modification of those read address signals. Used in this way, the read address signals control the writing of new data into a selected word location in the RAM block in such a way that fewer write cycles are required to change the contents of a word location. For example, only two write cycles may be required to change a word of any length. If a word may include "don't care" bits, then three write cycles may be required to change a word of any length.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
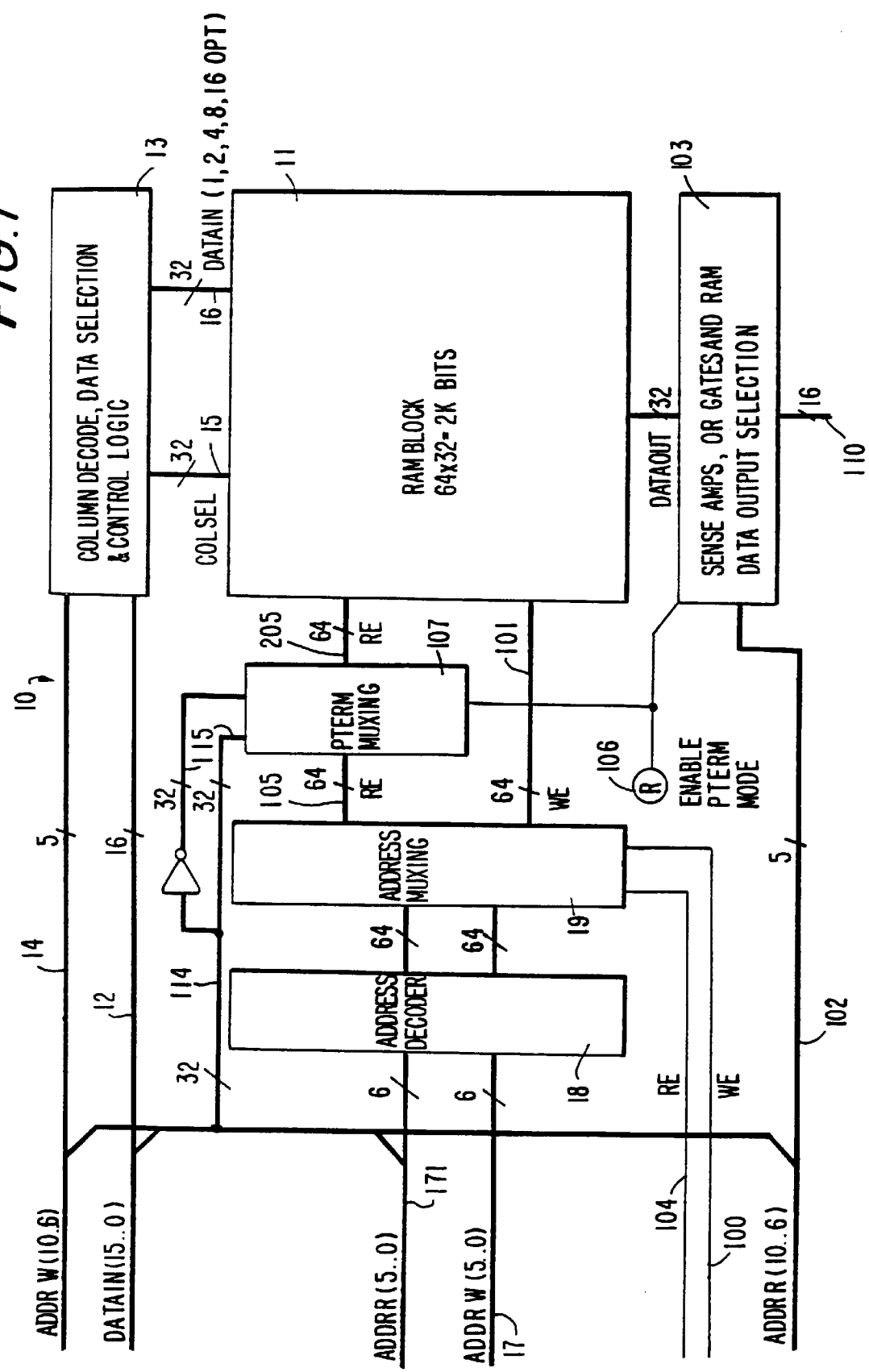
FIG. 1 is a simplified schematic block diagram of an illustrative RAM region which can be modified in accordance with this invention to facilitate the provision of content addressable memory capabilities.
Figure 2:
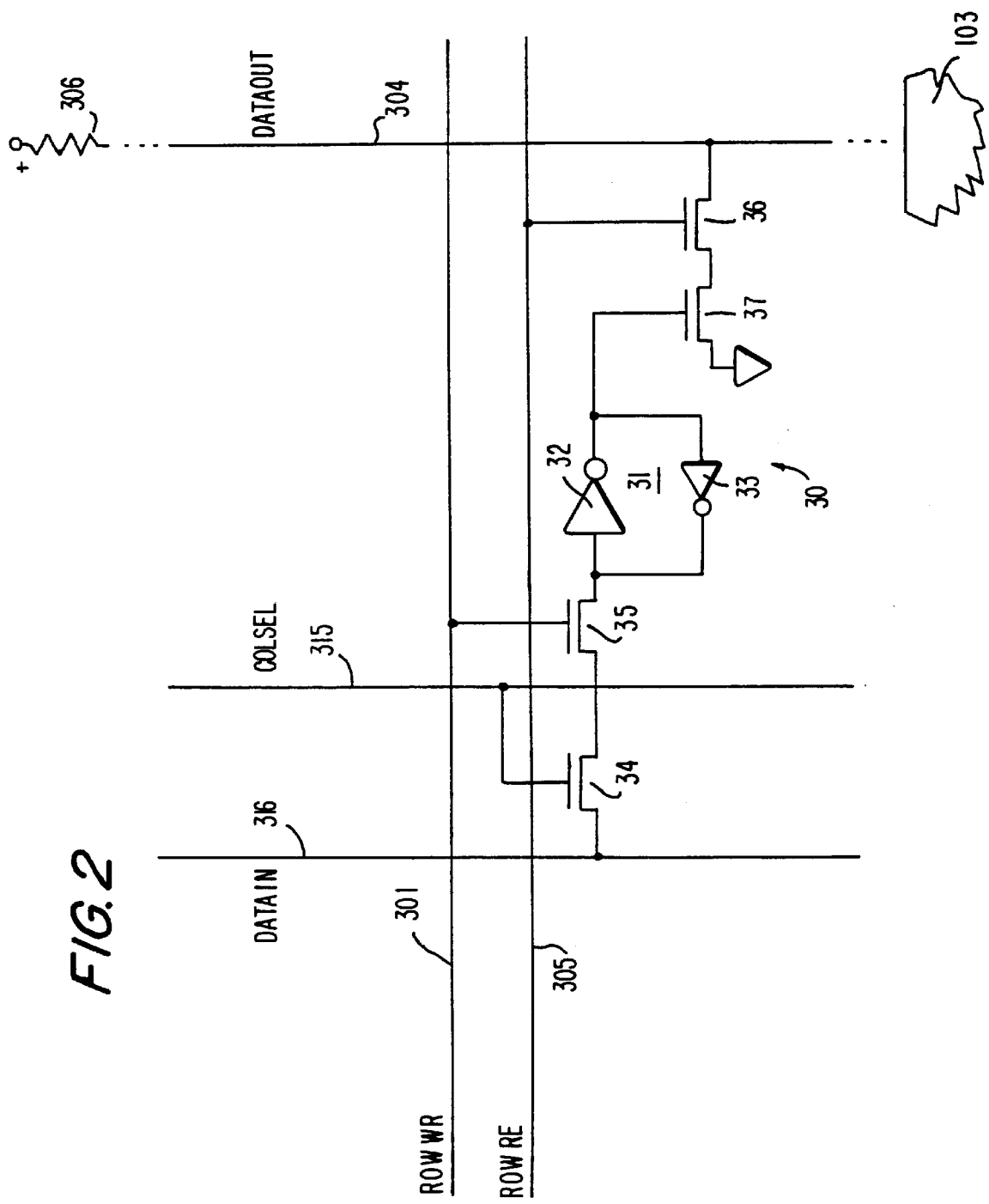
FIG. 2 is a more detailed but still simplified schematic block diagram of an illustrative embodiment of a representative portion of the FIG. 1 circuitry.
Figure 3:
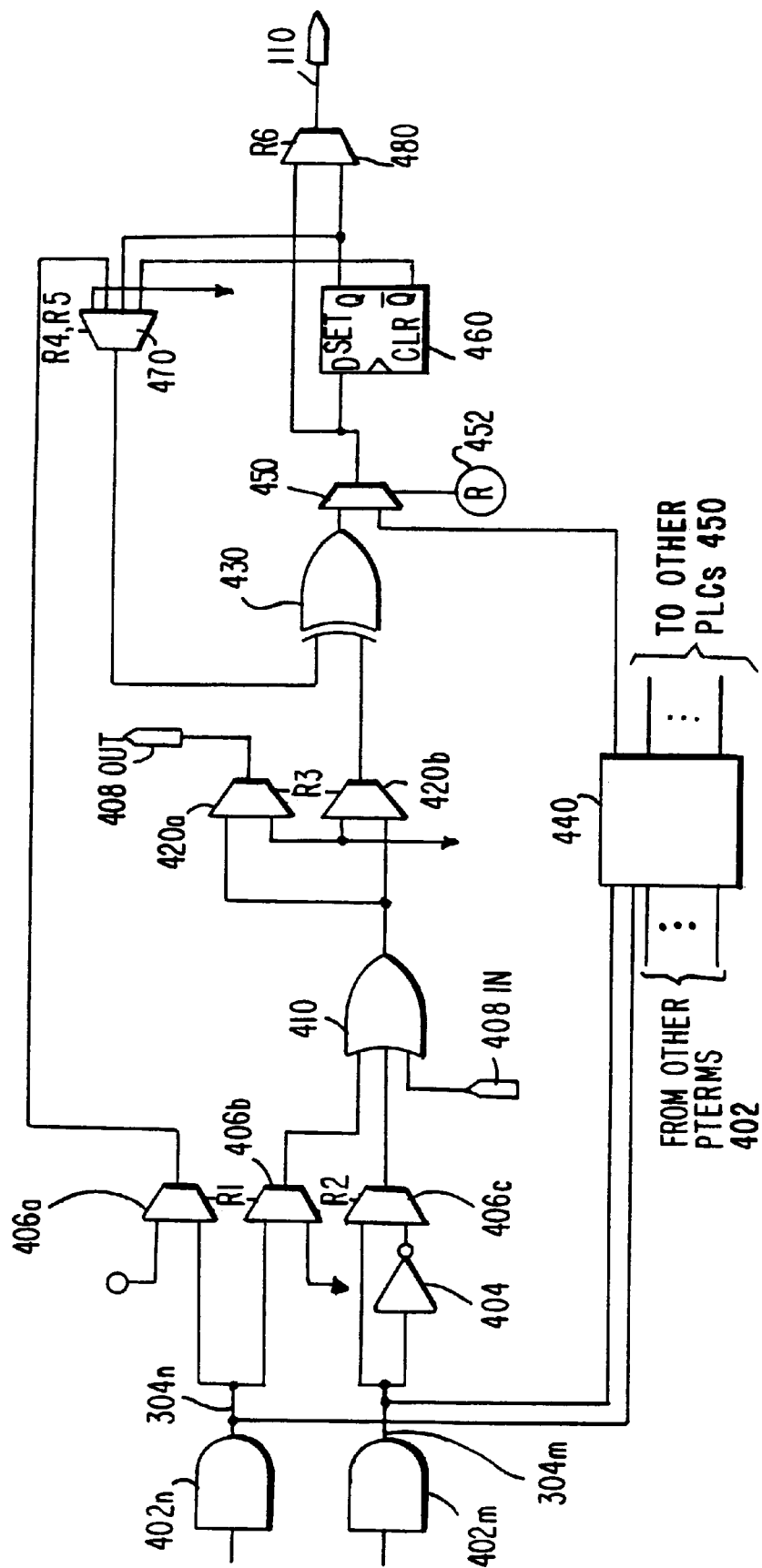
FIG. 3 is a more detailed but still simplified schematic block diagram of an illustrative embodiment of another portion of the FIG. 1 circuitry.
Figure 4:
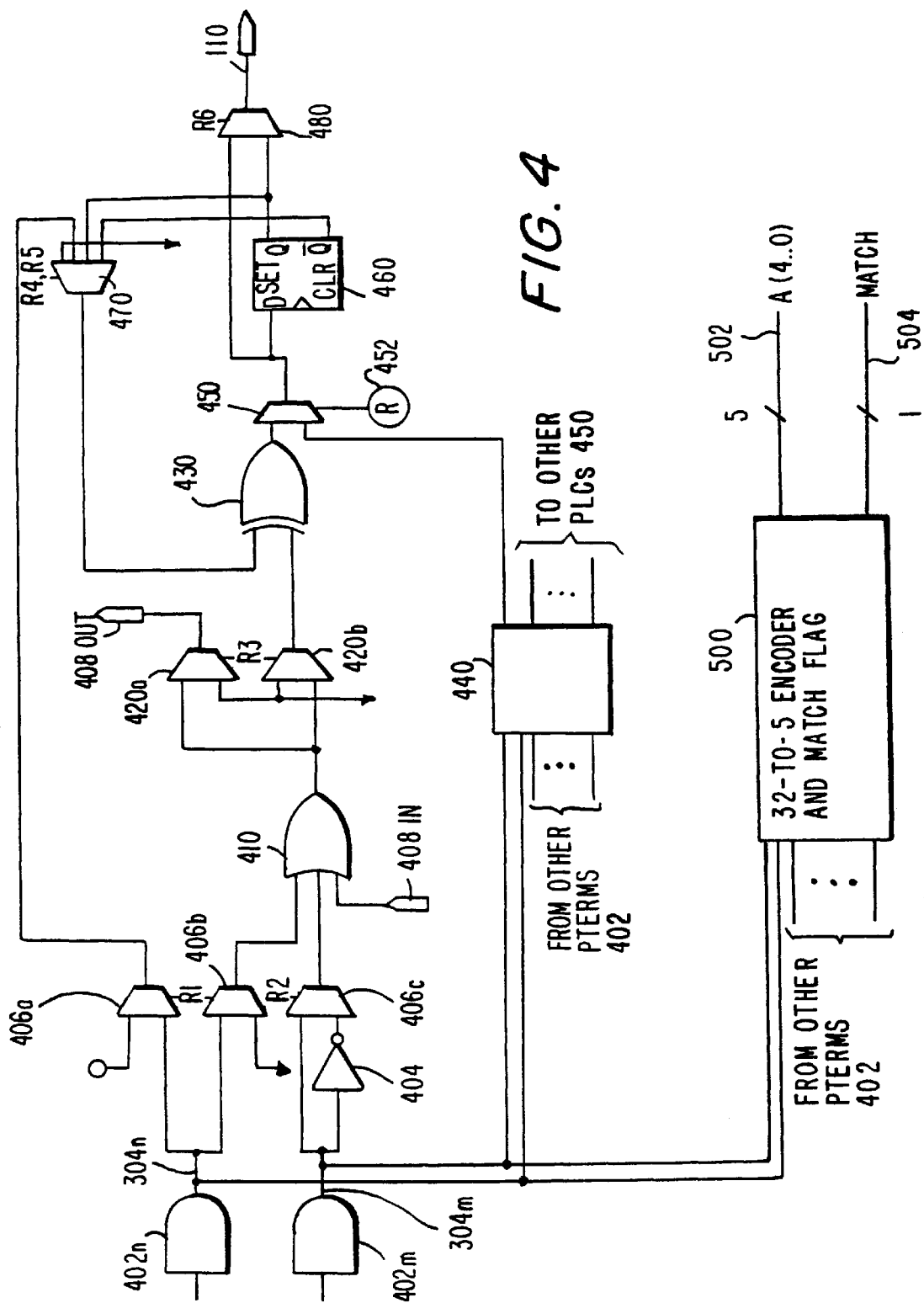
FIG. 4 is a simplified block diagram showing an illustrative embodiment of circuitry added to the FIG. 3 circuitry to implement certain aspects of this invention.

FIGS. 1–3 are respectively substantially identical to FIGS. 1, 3, and 4 in the immediately above-mentioned reference and will be briefly described as an aid to understanding the present invention. FIG. 1 shows a typical RAM region 10 that can be included as part of a programmable logic device. Examples of programmable logic devices that can include RAM regions 10 in accordance with this invention are shown in Cliff et al. U.S. Pat. No. 5,550,782, Cliff et al. U.S. Pat. No. 5,689,195, Cliff et al. U.S. Pat. No. 5,909,126, Cliff et al. U.S. Pat. No. 5,963,049, and Jefferson et al. U.S. Pat. No. 6,215,326, all of which are hereby incorporated by reference herein in their entireties. RAM region 10 is usable either as RAM or to perform p-term logic. A typical RAM cell 30 included in the RAM block 11 of RAM region 10 is shown in FIG. 2. RAM cell 30 includes relatively strong inverter 32 and relatively weak inverter 33 connected in a closed loop series. Data on DATAIN lead 316 can be written into RAM cell 30 by using a logic 1 signal on Column Select lead 315 to turn on transistor 34 while transistor 35 is turned on by a logic 1 signal on Row Write lead 301. Inverter 33 is not strong enough to modify the Data In signal from lead 316, but it is strong enough to hold inverter 32 in the state that it is left by the last Data In signal that it received. Data can be read from RAM cell 30 by using a logic 1 signal on Row Read lead 305 to turn on transistor 36. If the output of inverter 32 is logic 1, transistor 37 will also be turned on and DATAOUT lead 304 will be pulled low. On the other hand, if the output of inverter 32 is logic 0, transistor 37 will not be turned on and cell 30 will not pull Data Out lead 304 down. Weak pull up 306 keeps Data Out lead 304 at logic 1 unless one (or more) of the RAM cells 30 connected to that lead is pulling down on the lead.

RAM block 11 includes 64 rows and 32 columns of RAM cells 30. All of the 64 RAM cells 30 in a given column are connected to one common DATAIN lead 316, one common Column Select lead 315, and one common DATAOUT lead 304 uniquely associated with that column. Similarly, all of the 32 RAM cells 30 in a given row are connected to one common Row Write lead 301 and one common Row Read lead 305 uniquely associated with that row. The number of rows and columns in RAM block 11 is arbitrary and can be changed if desired.

FIG. 1 will now be further explained with reference to use of RAM region 10 as RAM. Features related to use of RAM region 10 for p-term logic will be described later.

As many as 16 bits of data to be written into RAM block 11 can be applied in parallel via Data In leads 12. Alternatively, only eight, four, two, or one bit of data may be applied in parallel via leads 12. The RAM block 11 columns into which the data on leads 12 are to be written are identified by the Address Write signals on leads 14. Column decode, data selection, and control logic 13 applies logic 1 signals to the Column Select leads 15 for the columns to receive the data, and also steers the one, two, four, eight, or 16 data bits to Data In leads 16 in groups of one, two, four, eight, or 16, depending on how circuitry 13 is controlled by associated programmable function control elements ("FCEs") (not shown separately in FIG. 1). A representative one of leads 16 is shown in part as lead 316 in FIG. 2, and a representative one of leads 15 is shown in part as lead 315 in FIG. 2. The RAM block row into which the data on leads 16 is written is selected by the signals on Address Write leads 17. Address decoder 18 decodes the signals on leads 17 to select one of 64 outputs. A logic 1 Write Enable signal on lead 100 causes address muxing 19 to pass the one-of-64 selection of decoder 18 on to the corresponding one of 64 leads 101 (a representative one of which is shown in part as lead 301 in FIG. 2).

To read data from RAM block 11, Address Read signals on leads 102 are used to select the columns from which the data will be read, and Address Read signals on leads 171 are used to select the rows from which the data will be read. Sense amps, OR gates, and RAM data output selection circuitry 103 responds to the signals on leads 102 and the above-mentioned FCEs that indicate whether one, two, four, eight, or 16 data bits are being handled in parallel to select from among the 32 Data Outs (304 in FIG. 2) the appropriate ones to be applied to leads 110. Address decoder 18 decodes the signals on leads 171 to select the one of 64 rows from which the data is to be read. A logic 1 Read Enable signal on lead 104 causes address muxing 19 to pass this selection on to the appropriate one of 64 leads 105. In RAM mode p-term multiplexing 107 passes on signals from leads 105 to leads 205 (a representative one of which is shown in part as Row Read lead 305 in FIG. 2).

In p-term mode FCE 106 is programmed to cause p-term multiplexing 107 to use leads 115 (rather than leads 105) as the signal sources for leads 205. Leads 115 carry the true and complement versions of 32 signals (on leads 114) derived from Address Write leads 14 (five signals), Data In leads 12 (16 signals), Address Read leads 171 (six signals), and Address Read leads 102 (five signals). Thus, instead of only one of the 64 Read Enable leads 205 carrying a logic 1 signal as in a RAM mode read operation, in a p-term mode read operation 32 of leads 205 will each carry a logic 1 signal. (The other 32 of leads 205 will each carry a logic 0 signal.) This enables each Data Out lead 304 in RAM block 11 to provide an output signal which is the logical product of the signals on leads 205 and the data stored in the RAM cells 30 served by that Data Out lead 304.

From the foregoing it will be appreciated that in p-term mode the signal on each lead 114 is applied in true form to one row of RAM block 11 and in complement form to another row of RAM block 11. Thus in each column of RAM block 11 two RAM cells 30 are associated with each lead 114. One of these RAM cells 30 stores a so-called "true RAM bit" that is accessed by the true version of the associated lead 114 signal. The other of these RAM cells 30 stores a so-called "complement RAM bit" or "comp RAM bit" that is accessed by the complement version of the associated lead 114 signal.

An illustrative embodiment of circuitry 103 is shown in more detail in FIG. 3. Each of AND gates 402 represents the logical AND function performed by the circuitry connected to a respective one of Data Out leads 304 in FIG. 2. In RAM mode circuitry 440 is used to select particular Data Out signals 304 for application to programmable logic connectors ("PLCs"; e.g., multiplexers) like depicted PLC 450. Circuitry 440 is therefore controlled by Address Read signals 102 (FIG. 1) and the one-two-four-eight-or-16 option control FCEs mentioned above in connection with FIG. 1. In RAM mode each PLC 450 is controlled by the associated FCE 452 (which can be the same as FCE 106 in FIG. 1) to pass the applied circuit 440 output signal. The output signal of each PLC 450 can be output directly to the associated lead 110, or registered by the associated flip-flop 460 and then output to lead 110. PLC 480 (controlled by FCE R6) selects whether the registered or unregistered signal is applied to lead 110. The other circuitry shown in FIG. 3 is not used in RAM mode.

In p-term mode circuitry 440 is not used, and the other circuitry shown in FIG. 3 is used instead. Without repeating all the details described in the reference from which FIG. 3 has been substantially reproduced, the principal point is that OR gates like 410 are provided to form logical sums of product term signals applied to those OR gates. Anywhere from 16 two-p-term sums to one 32-p-term sum can be produced. PLCs 450 are programmed to pass the sum signals, which can then be output either with or without registration by a flip-flop 460 as described above in connection with RAM mode.

Operation of a p-term (i.e., column) in RAM block 11 as a word of content addressable memory ("CAM") in accordance with this invention involves storing in the RAM cells 30 of that column data appropriate to recognizing a particular word of data applied to RAM block 11 via leads 114. Because of their similarity in this context to word lines in EPROM arrays in AND-OR logic devices (see, for example, Chan et al. U.S. Pat. No. 4,969,121, which is hereby incorporated by reference herein in its entirety), leads 114 are sometimes referred to herein as word lines. The following Table I shows the data that must be stored in the RAM cells 30 in RAM block 11 receiving (via leads 205) the true and complement of various values of a lead 114 signal in order to "recognize" those values as matching the data stored in those RAM cells. Table I also shows the various interpretations of RAM block 11 data that is not recognized as matching a lead 114 signal.

TABLE I

| Word Line Value (Lead 114) | TRUE RAM Bit 30 | COMP RAM Bit 30 | P-Term Value | P-Term Meaning for This Word Line 114 |
| --- | --- | --- | --- | --- |
| 0 | 0 | 1 | 0 | Not Recognized |
| 0 | 1 | 0 | 1 | Recognized |
| 1 | 0 | 1 | 1 | Recognized |
| 1 | 1 | 0 | 0 | Not Recognized |
| X | 0 | 0 | 1 | Don't Care |
| X | 1 | 1 | 0 | Disabled |

Table I shows (in its second line) that in order for a logic 0 signal on a lead 114 to be recognized as matching the corresponding portion of a word stored in a column of RAM block 11, the RAM cell 30 in that RAM block column receiving the true version of that lead 114 signal must contain logic 1, and the RAM cell 30 in that RAM block column receiving the complement version of that lead 114 signal must contain logic 0. Then the p-term value for that lead 114 signal will be logic 1. The p-term value thus referred to is the AND of the signals applied to that RAM block column's Data Out lead 304 from the transistors 36 of the RAM cells 30 receiving the true and complement versions of the lead 114 signal. The final p-term value for the signals on all of leads 114 is the AND of the Table I p-term value for all of the lead 114 signals.

Table I similarly shows (in its third line) that in order for a logic 1 signal on a lead 114 to be recognized as matching the corresponding portion of a word stored in a column of RAM block 11, the RAM cell 30 in that RAM block column receiving the true version of the lead 114 signal must contain logic 0 and the associated RAM cell 30 receiving the complement version of that signal must contain logic 1. Then both the true and complement RAM cells 30 will contribute logic 1 to the associated Data Out lead 304.

If a lead 114 is logic 0 and the associated true and complement RAM cells 30 contain 0 and 1, respectively, then the complement RAM cell 30 will apply logic 0 to the associated Data Out lead 304. This is the condition indicated in the first line in Table I. Any one (or more) logic 0 applied to a Data Out lead 304 will pull that lead to logic 0 and indicate that there is no match between the lead 114 signals and the data word stored in the RAM block 11 column associated with that Data Out lead. Similarly, if a lead 114 is logic 1 and the associated true and complement RAM cells 30 contain 1 and 0 respectively, then the true RAM cell 30 will apply logic 0 to the associated Data Out lead 304. This is the condition indicated in the fourth line of Table I. Again, this will pull the Data Out lead 304 to logic 0, thereby indicating that there is no match between the lead 114 signals and the data word stored in the RAM block column associated with that Data Out lead.

If the RAM cells 30 that receive the true and complement of a lead 114 signal both contain logic 0, then those RAM cells will both contribute logic 1 to the associated Data Out lead 304 regardless of the logical state (1 or 0) of that lead 114 signal. This nullifies the effect of that particular lead 114 signal in determining whether or not the applied data on leads 114 matches data stored in that column of RAM block 11. This "don't care" condition is indicated in the fifth line of Table I.

If the RAM cells 30 that receive the true and complement of a lead 114 signal both contain logic 1, then one or the other of those RAM cells will contribute logic 0 to the associated Data out lead 304 regardless of the logical state (1 or 0) of that lead 114 signal. This prevents the column in RAM block 11 that includes these RAM cells from ever recognizing (in the content addressable memory sense) data applied via leads 114. This "disabled" condition is indicated in the last line of Table I.

FIG. 4 shows illustrative augmentation of the FIG. 3 circuitry in accordance with this invention to support operation of RAM region 10 as a content addressable memory. Each of the 32 p-term signals 304 is applied to 32-to-5 encoder and match flag circuit 500. The match flag portion of circuit 500 can be circuitry for providing the logical OR of all 32 p-term signals 304 in order to produce a match output signal on lead 504. Match output signal 504 will therefore be logic 1 whenever one of p-term signals 304 indicates a match between the data stored in the associated column of RAM cells and the data applied via leads 114. If there is no match, match output signal 504 will be logic 0. (If it is desired to indicate when more than one match has been found, circuit 500 can include appropriate additional logic circuitry.) The 32-to-5 encoder portion of circuit 500 can be conventional logic for computing the five-bit binary address of the one of 32 p-terms 304 that is logic 1 when Match signal 504 indicates that there is one such logic 1 value among the 32 p-terms. The resulting five-bit binary address is output on Address leads 502. From the foregoing it will be seen that if circuitry 103 in FIG. 1 is augmented as shown in FIG. 4, circuitry 103 will have additional outputs 502 and 504 (see also FIG. 5, described below). (As an alternative to providing separate output leads 502 and 504 for the Address and Match output signals, those signals can be multiplexed onto a subset of leads 110).

Figure 5:
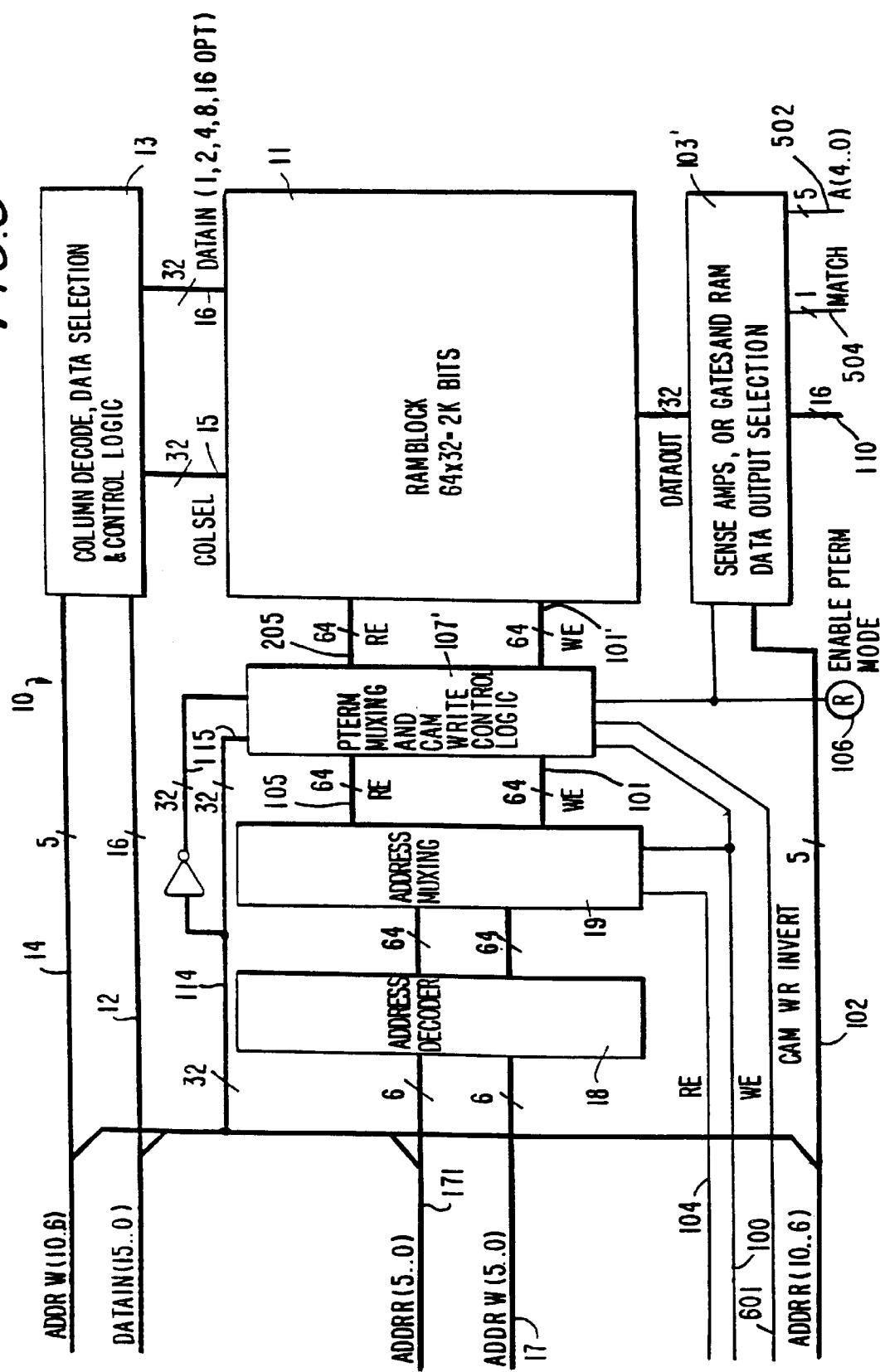
FIG. 5 is a simplified block diagram showing an illustrative embodiment of modifications of the FIG. 1 circuitry in order to implement further aspects of the invention.
Figure 6:
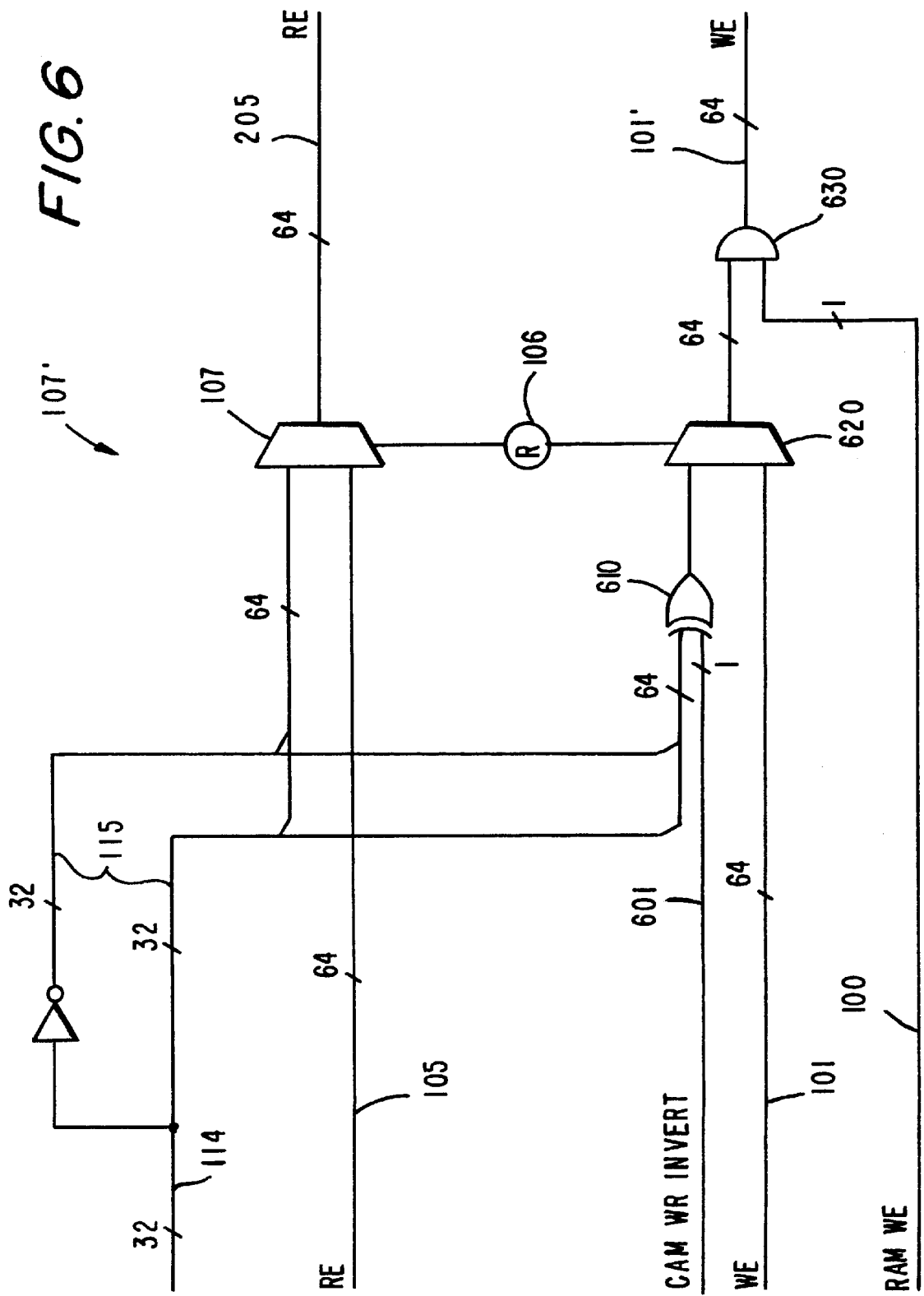
FIG. 6 is a more detailed but still simplified block diagram of an illustrative embodiment of a portion of the FIG. 5 circuitry.

FIGS. 5 and 6 show how the circuitry of FIG. 1 can be further modified in accordance with additional aspects of this invention to facilitate writing data into RAM block 11 when RAM region 10 is to be used as a content addressable memory. Because in the circuitry shown in FIG. 1 only one row can be written at a time, 64 successive write cycles are required to write the 64 true and complement RAM cell 30 values in a column of RAM block 11 that are required to enable that column to function as a word of content addressable memory (i.e., to determine whether or not to recognize a 32-bit word applied via leads 114). With the modified circuitry shown in FIGS. 5 and 6 only two write cycles are required if there are no "don't care" bits in the applied data, or only three write cycles are required if there are "don't care" bits. FIGS. 5 and 6 will be described first with reference to cases involving no "don't care" bits. Thereafter, the handling of "don't care" bit cases will be described.

As shown in FIGS. 5 and 6, p-term multiplexing 107 is augmented as p-term multiplexing and cam write control logic 107'. Just as during p-term and CAM read modes multiplexer 107 is controlled by FCE 106 to apply true and complement signals 115 to leads 205 (rather than applying signals 105 to leads 205), during p-term and CAM write modes multiplexer 620 (FIG. 6) is controlled by FCE 106 to apply true and complement signals 115—each gated by an associated EXCLUSIVE OR gate 610—to leads 101' (rather than applying signals 101 to leads 101'). The second input to each of EXCLUSIVE OR gates 610 is a common CAM Write Invert signal 601.

In order to store in a column of RAM block 11 the data required to allow that column to recognize a particular 32-bit word applied via leads 114, the word it is desired to recognize is asserted on leads 114. CAM Write Invert signal 601 is then made logic 0 and the Column Select and Data In leads 315 and 316 for the desired column are both made logic 1. RAM Write Enable signal 100 is also briefly made logic 1 to enable AND gates 630. Within the selected column this combination of signals causes all the RAM cells 30 for which the associated signal 115 is logic 1 to store logic 0 (because these logic 1 signals 115 are passed by EXCLUSIVE OR gates 610, multiplexer 620, and AND gates 630 to the associated Write Enable leads 101' (corresponding to leads 301 as shown by FIG. 2)). With reference to earlier Table I, this means that the true RAM bit 30 associated with each signal 114 that is logic 1 will now contain logic 0 and the complement RAM bit 30 associated with each signal 114 that is logic 0 will similarly contain logic 0. (Consistent with Table I, the content of a RAM cell 30 is identified by the output state of the inverter 32 of that RAM cell.)

After logic 0 has thus been stored in the necessary RAM cells 30, logic 1 is stored in the remaining RAM cells in the column being programmed as follows. The word to be recognized continues to be asserted on leads 114. CAM Write Invert signal 601 is changed to logic 1 and the Data in signal 316 of the column being programmed is changed to logic 0. RAM Write Enable signal 100 is then again briefly made logic 1. The logic 1 state of signal 601 causes all of leads 101' that were formerly not selected to be selected (i.e., to become logic 1). This causes of the RAM cells 30 in the column being programmed that did not previously store logic 0 to now store logic 1. In particular, the true RAM bits 30 associated with all signals 114 that are logic 0 now store logic 1, as do the complement RAM bits 30 associated with all signals 114 that are logic 1. The RAM block column being considered is now fully programmed in accordance with the second and third lines of Table I. When the data word on leads 114 that was thus used to program that column is again applied to leads 114 and RAM block 11 is read, that column will recognize the presence of that data word on leads 114.

If the data on leads 114 includes one or more "don't care" bits, those bits are set to logic 1 during the two programming write cycles described above. Then for a third programming write cycle the "don't care" bits on leads 114 are toggled to logic 0, while the other lead 114 signals are left at their correct values. CAM Write Invert signal 601 is set to logic 1, the Data In signal 316 for the column being programmed is set to logic 1, and RAM Write Enable signal 100 is briefly set to logic 1. This causes logic 1 to be written into the complement RAM cells 30 associated with the "don't care" bits on leads 114 without disturbing any of the data previously written into the other RAM cells in the column being programmed. After the third write cycle both the true and complement RAM bits 30 associated with each "don't care" signal 114 will be logic 0, which, as the fifth line in Table I shows, is the condition required to allow a column in RAM block 11 to effectively ignore a lead 114 signal.

FIG. 5 also shows modification of the circuitry 103 of FIG. 1 to circuitry 103' that includes Address and Match output signals 502 and 504 as described above in connection with FIG. 4. (Again, as an alternative to providing separate output leads 502 and 504 for the Address and Match output signals, those signals can be multiplexed onto a subset of leads 110.)

Figure 7:
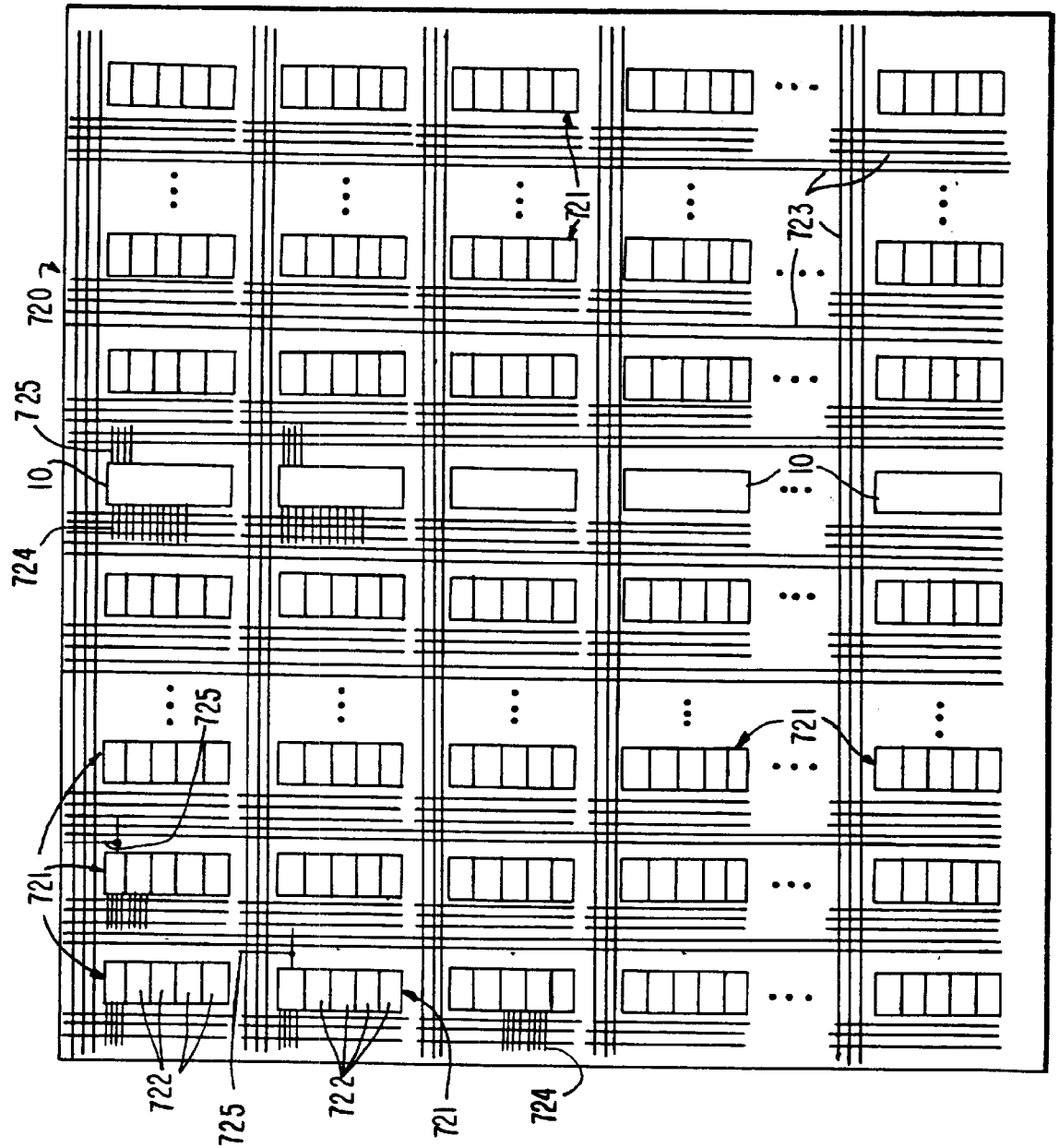
FIG. 7 is a simplified schematic block diagram of an illustrative programmable logic array integrated circuit device including memory regions in accordance with the invention.

FIG. 7 shows an illustrative programmable logic array integrated circuit device 720 which includes memory regions 10 as described above in accordance with this invention. In addition to a column of memory regions 10, programmable logic device 720 includes several columns of regions 721 of programmable logic. The regions 10 and 721 in the various columns additionally form horizontal rows of such regions. Each region 721 includes several subregions or modules 722 of programmable logic. Each logic module 722 is programmable to provide an output signal 725 which is any of several logical functions of a plurality of input signals 724 applied to that logic module. For example, each logic module 722 may include a four-input look-up table. Such a look-up table can be implemented as a relatively small (e.g., 16-bit) random access memory, which is much smaller than preferred memory regions 10 (e.g., each including a 2K-bit RAM block 11).

Interconnection conductors 723 of various types are provided for conveying signals to, from, and between the various regions 10 and 721, as well as making input and output connections to external circuitry. For example, some conductors 723 are associated with and extend along each of the rows of regions 10/721. Other conductors 723 are associated with and extend along each of the columns of regions 10 or 721. Still other conductors 723 are associated with individual regions 10 or 721 (e.g., for bringing signals from other nearby conductors 723 to the associated region 10 or 721). Input signals 724 are applied to the associated region 10 or 721 from these last-mentioned conductors, and output signals 725 from each region are also applied to nearby conductors 723. Programmable logic connectors ("PLCs") are provided for selectively connecting various conductors 723, 724, and 725 to one another at or near their intersections.

Only a few representative conductors 723, 724, and 725 are shown in FIG. 7. Additional information (not believed necessary for an understanding of the present invention) regarding suitable interconnection conductor arrangement can be found in other references such as Cliff et el. U.S. Pat. No. 5,550,782, Cliff et el. U.S. Pat. No. 5,689,195, Cliff et el. U.S. Pat. No. 5,909,126, Cliff et el. U.S. Pat. No. 5,963,049, and Jefferson et al. U.S. Pat. No. 6,215,326, all of which are hereby incorporated by reference herein in their entireties. With particular reference to memory regions 10, the input signals on leads 12, 14, 17, 100, 102, 104, 171, and 601 of a memory region 10 in FIG. 1 or 5 come from the input conductors 724 of that region in FIG. 7. Similarly, the output signals 110, 502, and 504 of a memory region 10 in FIG. 1 or 5 are applied to the output conductors 725 of that region in FIG. 7. The particular arrangement of interconnection conductors used on device 720 is in no way critical to the present invention, and any of a vast number of different interconnection conductor arrangements known in the art are equally suitable for such use. Similarly, the particular construction of logic regions 721 is not critical to this invention, and any of many different constructions known in the art can be used.

Figure 8:
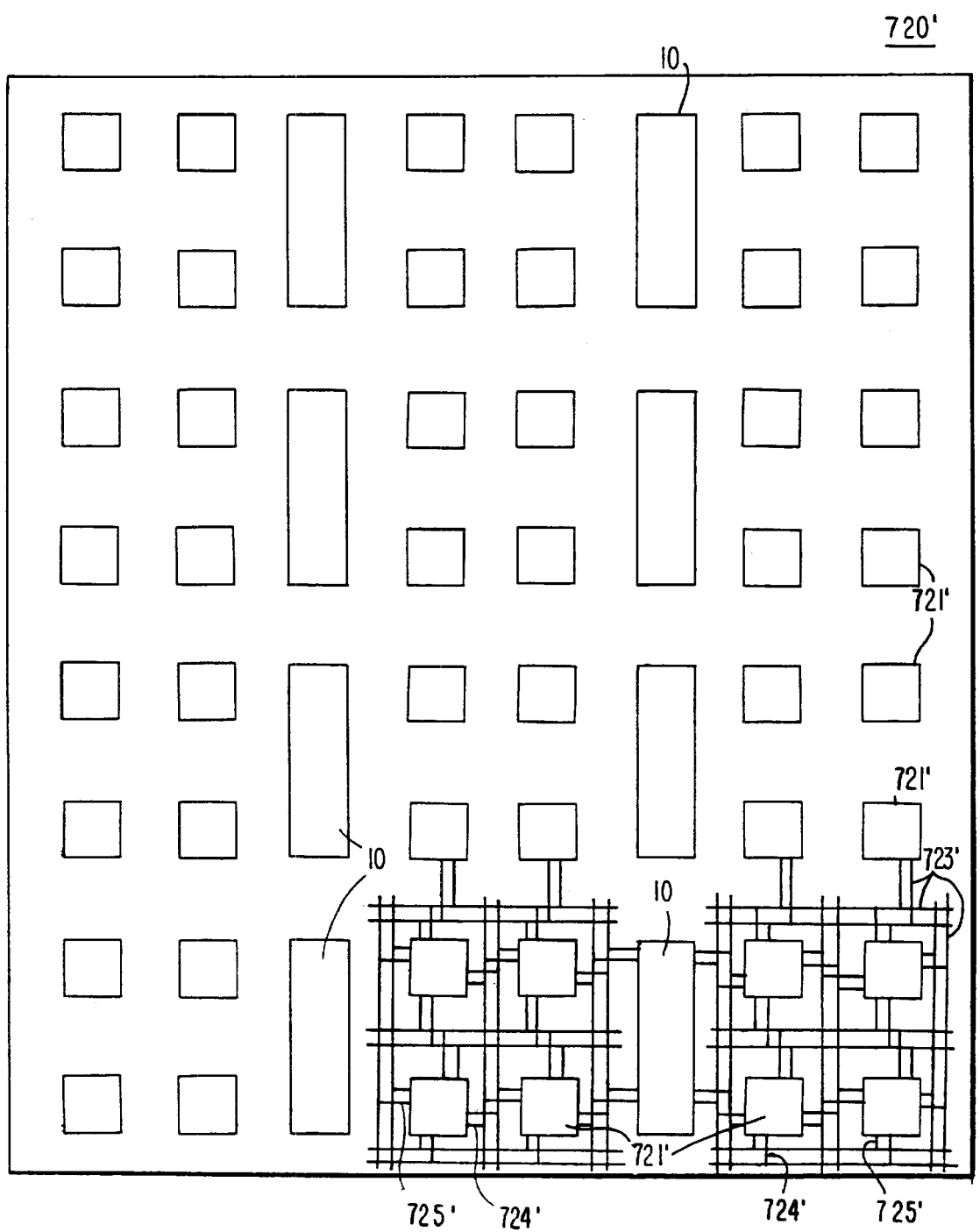
FIG. 8 is a simplified schematic block diagram of another illustrative programmable logic array integrated circuit device including memory regions in accordance with the invention.

FIG. 8 shows another example of a programmable logic device 720' having memory regions 10 as described above embedded among logic blocks 721'. Except for the modifications of this invention, device 720' may be constructed generally as shown in Freeman U.S. Pat. No. Re. 34,363, which is also hereby incorporated by reference herein in its entirety. Thus each logic block 721' may be a configurable logic block ("CLB") which includes one or two small look-up tables. Each memory region 10 and CLB 721' may be surrounded by interconnection conductors 723' for conveying signals to, from, and between memory regions 10 and CLBs '721, as well as making input and output connections to external circuitry. Each CLB 721' may receive signals 724' from the interconnection conductors 723' adjacent to any of its sides. Similarly, each CLB 721' may output signals 725' to any of its sides. As in the embodiment shown in FIG. 7, each memory region 10 is usable as content addressable memory. Again, the particular interconnection conductor arrangement and logic block construction used on device 720' are in no way critical to this invention.

Figure 9:
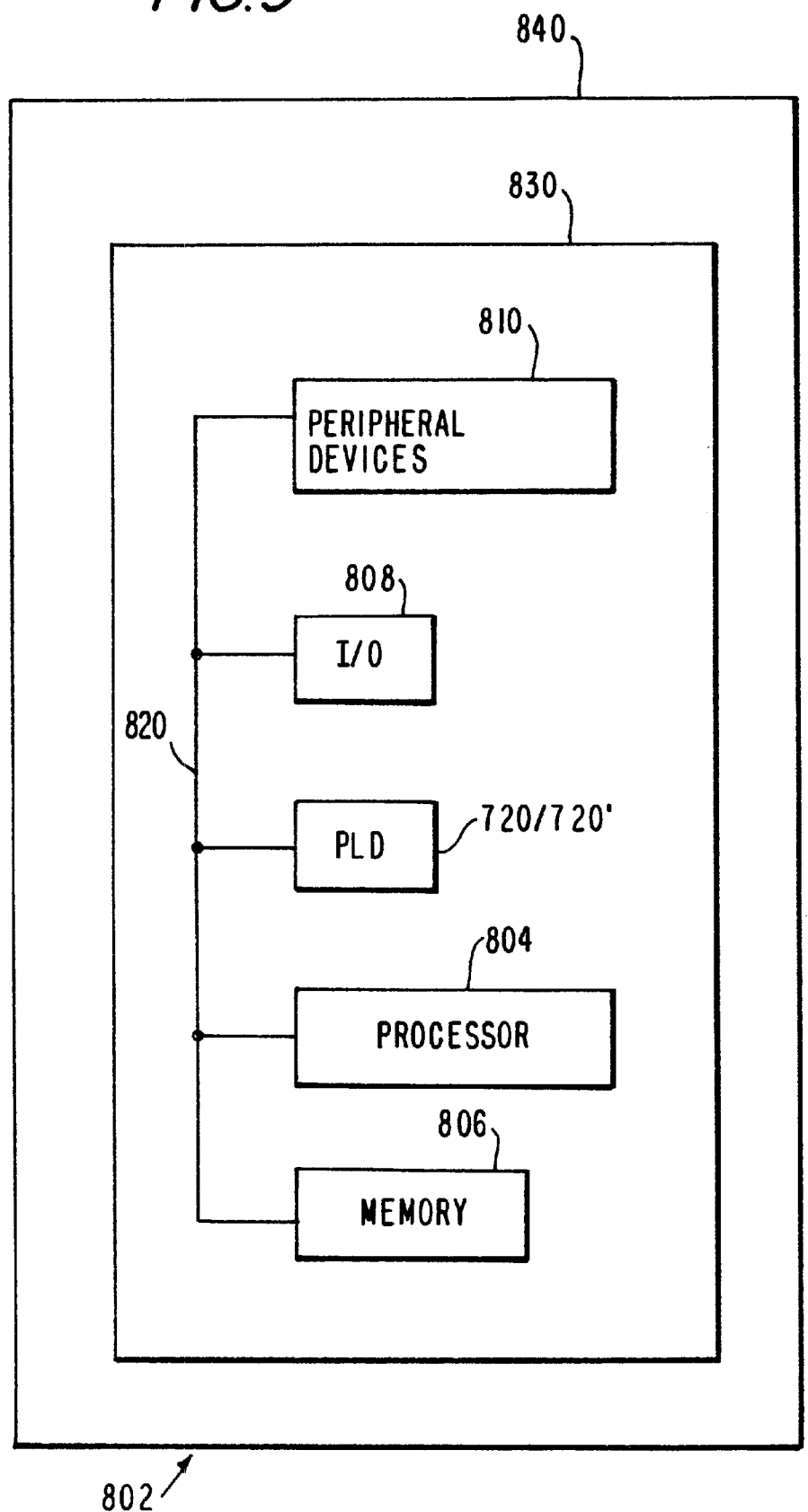
FIG. 9 is a simplified block diagram of an illustrative system employing a programmable logic device incorporating memory regions in accordance with the invention.

FIG. 9 illustrates a programmable logic device 720/720' of this invention in a data processing system 802. Data processing system 802 may include one or more of the following components: a processor 804; memory 806; I/O circuitry 808; and peripheral devices 810. These components are coupled together by a system bus 820 and are populated on a circuit board 830 which is contained in an end-user system 840.

System 802 can be used in a wide variety of applications, such as computer networking, data networking, instrumentation, video processing, digital signal processing, or any other application where the advantage of using programmable or reprogrammable logic is desirable. Programmable logic device 720/720' can be used to perform a variety of different logic functions. For example, programmable logic device 720/720' can be configured as a processor or controller that works in cooperation with processor 804. Programmable logic device 720/720' may also be used as an arbiter for arbitrating access to a shared resource in system 802. In yet another example, programmable logic device 720/720' can be configured as an interface between processor 804 and one of the other components in system 802. It should be noted that system 802 is only exemplary, and that the true scope and spirit of the invention should be indicated by the following claims.

Various technologies can be used to implement programmable logic devices 720/720' employing the memory regions 10 of this invention, as well as the various components of those memory regions. For example, function control elements 106 and other FCEs can be SRAMs, DRAMs, first-in first-out ("FIFO") memories, EPROMs, EEPROMS, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the particular numbers of rows and columns of memory cells mentioned above in the description of depicted array 11 are only illustrative, and different numbers of rows and columns (generically N rows and M columns) can be provided instead if desired. (When RAM region 10 is used on a programmable logic device 720 or 720' as in FIG. 7 or 8, it is preferable for N and M to be relatively large so that RAM region 10 will have significantly different logic capabilities than the relatively small individual logic modules 722 or regions 721/721' also included on the device. For example, N is preferably at least 16 and M is preferably at least eight. In the particular embodiment that has been described N is 64 and M and 32.) The words "row" and "column" are used arbitrarily herein, and no absolute or fixed directions or orientations are intended thereby. For example, these words can be interchanged in this specification and claims if desired. As another example of modifications within the scope of this invention, the polarities of various signals and logic mentioned herein are only illustrative, and other polarities can be used if desired. Thus the fixed potential to which each transistor 37 is connected could be logic 1 rather than logic 0 as shown in FIG. 2, and each Data Out conductor 304 could have a pull down connection to logic 0 rather than a pull up connection to logic 1 as shown in FIG. 2. Another example of this general type of modification would be to connect the gate of transistor 37 in FIG. 2 to the input of inverter 32 rather than to the output of that inverter. This would mean that the output of each memory cell would have the same polarity as the data applied to that cell.

The invention claimed is:

1. Memory circuitry, comprising:
   a plurality of memory cells organized as a two-dimensional array of intersecting rows and columns of such memory cells;
   a plurality of read enable leads, each of which is associated with a respective one of the rows and is configured to convey a read enable signal that selectively enables reading of data from the memory cells in the associated row;
   a plurality of write enable leads, each of which is associated with a respective one of the rows and is configured to convey a write enable signal that selectively enables writing of data to the memory cells in the associated row; and
   addressing circuitry configured to address the plurality of memory cells, the addressing circuitry being programmably configurable to allow the memory circuitry to be operated in a plurality of modes, wherein in a first mode of operation, the memory circuitry is operable as random access memory, and wherein in a second mode of operation, the memory circuitry is configured to perform product-term logic, and wherein in a third mode of operation, the memory circuitry is operable as content addressable memory, and wherein the addressing circuitry includes enable signal multiplexing logic, the enable signal multiplexing logic being programmably configurable when the memory circuitry is being operated as a content addressable memory to apply a set of multiplexed write enable signals on the respective write enable leads associated with multiple rows of memory cells such that at least a subplurality of memory cells in a specific column corresponding to a word location within the content addressable memory are writeable in parallel.

2. The memory circuitry defined in claim 1, wherein in the first mode of operation:
   each memory cell is individually addressable by the addressing circuitry.

3. The memory circuitry defined in claim 1, further comprising:
   a plurality of column output lines, each of which is associated with a respective one of the columns of memory cells, wherein each column output line is configured to selectively respond to data stored in the memory cells in the associated column.

4. The memory circuitry defined in claim 3, wherein in the second and third modes of operation:
   each column output line selectively responds to data stored in the memory cells in the associated column by providing a column output signal that is a logical combination of a set of logic values indicative of the stored data.

5. The memory circuitry defined in claim 4, wherein the addressing circuitry further includes:
   a plurality of read address leads for conveying a plurality of read address signals; and
   a plurality of write address leads for conveying a plurality of write address signals, wherein the enable signal multiplexing logic is programmably configurable to generate a first set of read enable signals from the read address signals and a first set of write enable signals from the write address signals.

6. The memory circuitry defined in claim 5, wherein:
the enable signal multiplexing logic is programmably configurable to generate a second set of read enable signals from a combination of signals that includes the read address signals and the write address signals.

7. The memory circuitry defined in claim 6, wherein:
in the first mode of operation, the enable signal multiplexing logic is programmably configurable to apply the first set of read enable signals on the read enable leads such that the associated column output signal of a given column is indicative of data read from a respective one of the memory cells in that given column; and
in the second and third modes of operation, the enable signal multiplexing logic is programmably configurable to apply the second set of read enable signals on the read enable leads such that the associated column output signal of a particular column corresponds to a logical combination of logic values indicative of data read from multiple memory cells in that particular column.

8. The memory circuitry defined in claim 5, wherein:
the enable signal multiplexing logic is programmably configurable to generate a second set of write enable signals from a combination of signals that includes the read address signals and the write address signals.

9. The memory circuitry defined in claim 8, wherein:
the enable signal multiplexing logic is programmably configurable to apply the first set of write enable signals on the write enable leads to enable writing to a respective one of the memory cells in a given column, and wherein in an alternative configuration, the enable signal multiplexing logic is programmably configurable to apply the second set of write enable signals as the set of multiplexed write enable signals on the respective write enable leads associated with the multiple rows of memory cells.

10. A programmable logic device including memory circuitry as defined in claim 1.

11. The programmable logic device defined in claim 10 further comprising:
a plurality of modules of programmable logic, wherein each module includes a four-input look-up table.

12. A digital processing system comprising:
processing circuitry;
a memory coupled to said processing circuitry; and
a programmable logic device as defined in claim 10 coupled to the processing circuitry and the memory.

13. A printed circuit board on which is mounted a programmable logic device as defined in claim 10.

14. The printed circuit board defined in claim 13 further comprising:
a memory mounted on the printed circuit board and coupled to the programmable logic device.

15. The printed circuit board defined in claim 13 further comprising:
processing circuitry mounted on the printed circuit board and coupled to the programmable logic device.

16. Memory circuitry, comprising:
a plurality of memory cells, wherein each memory cell is responsive to a read enable signal that selectively enables reading data from that memory cell, and wherein each memory cell is further responsive to a write enable signal that selectively enables writing data to that memory cell;
a first circuit associated with the plurality of memory cells, the first circuit being programmably configurable to enable operation of the memory circuitry as random access memory; and
a second circuit associated with the plurality of memory cells, the second circuit being programmably configurable to enable performance of product-term logic by the memory circuitry in a first operating mode, and being further programmably configurable to enable operation of the memory circuitry as content addressable memory in a second operating mode, and wherein the second circuit includes multiplexing circuitry, the multiplexing circuitry being programmable in a first configuration to apply true and complement values of a first set of aggregated signals in parallel to the plurality of memory cells as read enable signals, and wherein the multiplexing circuitry is further programmable in a second configuration to apply true and complement values of a second set of aggregated signals in parallel to the plurality of memory cells as write enable signals.

17. The memory circuitry defined in claim 16, wherein the plurality of memory cells is organized as a two-dimensional array of intersecting rows and columns of such memory cells.

18. The memory circuitry defined in claim 17, wherein the second circuit generates a product-term signal by logically combining a set of logic values indicative of data stored in a respective one of the columns of memory cells.

19. The memory circuitry defined in claim 18, wherein a respective one of the columns of memory cells corresponds to a word of content addressable memory when the memory circuitry is operated as content addressable memory.

20. A method of operating a memory circuit having a plurality of memory cells organized as a two-dimensional array of intersecting rows and columns of such memory cells, the method comprising:
performing product-term logic using product-term generation circuitry associated with the memory circuit in a first operating mode;
implementing a content addressable memory by reusing the product-term generation circuitry to access the content addressable memory in a second operating mode; and
writing to a given column of memory cells a first set of logic values indicative of a word to be recognized by the content addressable memory, wherein the word has an associated length, and wherein a maximum number of clock cycles required for the writing is independent of the length of the word.

21. The method defined in claim 20, further comprising:
configuring the memory circuit as random access memory in a third operating mode.

22. The method defined in claim 20, wherein the performing of the product-term logic further comprises:
generating a product term signal by logically combining a second set of logic values indicative of data stored in a selected column of memory cells.

23. The method defined in claim 22, wherein the implementing of the content addressable memory further comprises:

addressing the memory cells in the given column for reading with a third set of logic values; and generating a match signal indicative of whether the third set of logic values corresponds to the word stored in the given column of memory cells by logically combining the data read from the memory cells in the given column.

24. A programmable logic device including memory circuitry as defined in claim 16.

25. A digital processing system comprising:

a plurality of subsystem components;

the programmable logic device of claim 24; and a system bus configured to couple the programmable logic device to the plurality of subsystem components.

26. The method defined in claim 20 further comprising:

implementing the memory circuit on a programmable logic device.

27. The method defined in claim 26 further comprising:

including the programmable logic device in a digital processing system having a plurality of subsystem components; and coupling the programmable logic device to the plurality of subsystem components via a system bus.

\* \* \* \* \*